(12) United States Patent
Jeong et al.

(10) Patent No.: US 7,551,255 B2
(45) Date of Patent: Jun. 23, 2009

(54) ORGANIC LIGHT EMITTING DISPLAY DEVICE

(75) Inventors: Jae Kyeong Jeong, Yongin (KR); Jae Bon Koo, Yongin (KR); Hyun Soo Shin, Yongin (KR); Yeon Gon Mo, Yongin (KR); Jong Han Jeong, Yongin (KR); Hun Jung Lee, Yongin (KR); Sung Jin Kim, Yongin (KR)

(73) Assignee: Samsung Mobile Display Co., Ltd., Yongin (KR)

( * ) Notice: Subject to any disclaimer, the term of this patent is extended or adjusted under 35 U.S.C. 154(b) by 374 days.

(21) Appl. No.: 11/486,595

(22) Filed: Jul. 13, 2006

(65) Prior Publication Data

US 2007/0018170 A1    Jan. 25, 2007

(30) Foreign Application Priority Data

Jul. 20, 2005    (KR)    ............... 10-2005-0065943

(51) Int. Cl.
*G02F 1/1343* (2006.01)
*G02F 1/1345* (2006.01)
*H01L 29/04* (2006.01)
*H01L 31/036* (2006.01)
*H01L 31/0376* (2006.01)
*H01L 31/20* (2006.01)

(52) U.S. Cl. ............... 349/139; 349/149; 349/150; 257/59; 257/72; 257/258; 257/291

(58) Field of Classification Search ............... None
See application file for complete search history.

(56) References Cited

U.S. PATENT DOCUMENTS

| 2002/0027247 | A1 | 3/2002 | Arao et al. |
| 2003/0047280 | A1* | 3/2003 | Takayama et al. ........... 156/344 |
| 2005/0116237 | A1* | 6/2005 | Voutsas ........... 257/79 |

FOREIGN PATENT DOCUMENTS

| JP | 2003-45890 | 2/2003 |
| JP | 2003-45890 A | 2/2003 |

(Continued)

OTHER PUBLICATIONS

Patent Abstracts of Japan, Publication No. 2003-045890, Published on Feb. 14, 2003, in the name of Yamazaki, et al.

(Continued)

*Primary Examiner*—Michelle R Connelly Cushwa
(74) *Attorney, Agent, or Firm*—Christie, Parker & Hale, LLP (57) ABSTRACT

An organic light emitting display device including a flexible substrate and a plurality of thin film transistors (TFTs) formed on the substrate. The plurality of TFTs formed on the substrate include a pixel transistor for driving a pixel and a driver circuit transistor for driving a driver circuit, and a longitudinal direction of a channel region of the pixel transistor makes a first predetermined angle with a direction in which the substrate is bent. As such, it is possible to minimize a change in the electrical property of the TFTs formed on the flexible substrate and to thus reduce a change in the amount of current that flows in the channels of the TFTs.

18 Claims, 8 Drawing Sheets

FOREIGN PATENT DOCUMENTS

KR  10-2004-0105359  12/2004

OTHER PUBLICATIONS

Korean Patent Abstracts, Publication No. 1020040105359 A, Published on Dec. 16, 2004, in the name of Kim, et al.

European Search Report dated Dec. 1, 2006, for 06117552.7, in the name of Samsung SDI Co., Ltd.

Servati, et al., *Functional Pixel Circuits for Elastic AMOLED Displays*, Proceedings of the IEEE, vol. 93, No. 7, Jul. 2005, pp. 1257-1264, XP-002404749.

SIPO Office action dated Sep. 19, 2008, for corresponding Chinese application 200610106171.8, with English translation indicating relevance of cited U.S. Patent 6,720,577 (filed as U.S. Publication 2002/0027247 in the Feb. 27, 2007 IDS).

\* cited by examiner

FIG. 8 ly, it is an aspect of the present invention to

ORGANIC LIGHT EMITTING DISPLAY DEVICE

CROSS-REFERENCE TO RELATED APPLICATION

This application claims priority to and the benefit of Korean Patent Application No. 10-2005-0065943, filed on Jul. 20, 2005, in the Korean Intellectual Property Office, the entire content of which is incorporated herein by reference.

BACKGROUND

1. Field of the Invention

The present invention relates to an organic light emitting display device, and more particularly, to an organic light emitting display device capable of minimizing a change in an electrical property of a thin film transistor (TFT) formed on a flexible substrate when the flexible substrate is bent in one or more directions.

2. Discussion of Related Art

Recently, a technology has been developed for forming a thin film transistor (TFT) using a semiconductor layer formed on an insulating substrate. The TFTs are used for electronic devices such as an integrated circuit and an electro-optical device, and more particularly, are used as switching devices and driving devices for organic light emitting display devices. Insulating substrates such as glass and quartz used for forming the above-described TFTs are fragile and heavy such that they cannot be easily made large and thus cannot be easily mass-produced.

In order to solve the above problem, recently, TFTs are formed on a thin substrate, for example, a thin film-shaped metal substrate or a film-shaped plastic substrate. Since the thin film-shaped metal substrate and the film-shaped plastic substrate can be made to be flexible as well as thin and light, it can be used for a cylindrical display device as well as for a conventional display device (or show window).

However, since the film-shaped plastic substrate is vulnerable to heat and is sensitive to change in temperature, when the TFTs are formed on the film-shaped plastic substrate, the TFTs must be manufactured at a low temperature. Therefore, when the TFTs are formed on the film-shaped plastic substrate, the performance of the TFTs may deteriorate more easily as compared with the case in which the TFTs are formed on a glass substrate.

Therefore, in order to solve the above problem, it is suggested that an organic light emitting display device including the TFTs formed on the thin film-shaped metal substrate be formed. The thin film-shaped metal substrate is not completely bendable, however; the thin file-shaped metal substrate is less vulnerable to moisture and oxygen and can undergo high temperature processes. Therefore, when the thin film-shaped metal substrate is used, it is possible to manufacture the TFTs having high channel mobility. Therefore, it is possible to realize a system on panel (SOP) in which a driving circuit is simultaneously integrated with a pixel. Also, since the metal substrate is flexible, it is possible to realize a high resolution and high performance roll type display device.

Figure 1:
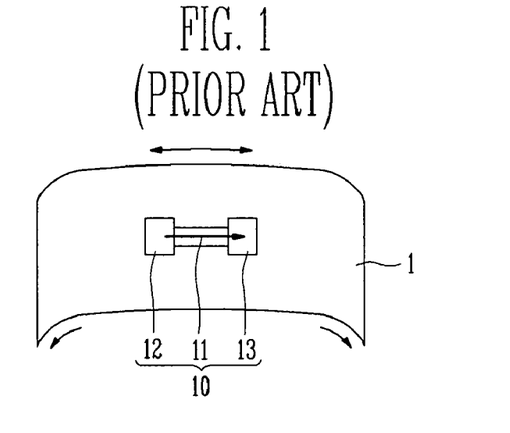
FIG. 1 schematically illustrates a thin film transistor (TFT) formed on a flexible substrate.

FIG. 1 schematically illustrates a TFT formed on a flexible substrate. Referring to FIG. 1, a TFT 10 includes a semiconductor layer having a channel region 11, a source electrode 12, and a drain electrode 13 formed on a flexible substrate 1. In FIG. 1, the channel region 11 of the TFT 10 is formed to be parallel to the direction in which the substrate 1 is bent.

However, when a TFT is formed on a flexible substrate as described above, the array (or structure) of the TFT is strained in the direction where the substrate is bent. In general, when stress is applied to the semiconductor layer that forms the TFT, charge mobility and effective charge mass are affected by the stress so that the electrical property of the TFT changes. To be specific, when the direction in which the substrate is bent is parallel to the direction in which the channel of the TFT is formed (that is, the direction in which current flows), a change in a strain-induced drain current increases so that an electrical property of the TFT changes.

SUMMARY OF THE INVENTION

Accordingly, it is an aspect of the present invention to provide an organic light emitting display device in which channel regions of thin film transistors (TFTs) formed on a flexible substrate make a predetermined angle with the direction in which the substrate is bent so that a change in an electrical property of the TFTs can be minimized.

In one embodiment of the present invention, there is provided an organic light emitting display device including a flexible substrate and a plurality of thin film transistors (TFTs) formed on the substrate. The plurality of TFTs formed on the substrate include a pixel transistor for driving a pixel and a driver circuit transistor for driving a driver circuit, and a longitudinal direction of a channel region of the pixel transistor makes a first predetermined angle with a direction in which the substrate is bent.

In one embodiment, a longitudinal direction of a channel region the driver circuit transistor is formed to make a second predetermined angle with the longitudinal direction of the channel region of the pixel transistor.

In one embodiment, the pixel transistor includes a switching transistor and a driving transistor. In one embodiment, a longitudinal direction of a channel region of the switching transistor is different from a longitudinal direction of a channel region of the driving transistor. In one embodiment, a longitudinal direction of a channel region of the driving transistor is formed in substantially the same direction as the direction in which the substrate is bent.

In one embodiment, the first predetermined angle of the longitudinal direction of the channel region of the pixel transistor makes with the direction in which the substrate is bent is in the range of from about 45° to about 90°.

In one embodiment, the substrate includes at least one of a metal material or a plastic material, and a characteristic of the substrate is to be transformed by an application of an external force on the substrate. In one embodiment, the metal material includes at least one of a stainless steel (sus) material or a titanium (Ti) material.

In one embodiment, at least one of the thin film transistors formed on the substrate includes a semiconductor layer formed with low temperature polysilicon.

In one embodiment, the semiconductor layer includes germanium (Ge) and/or a Ge compound.

In one embodiment, the display device further includes an organic light emitting diode electrically connected with at least one of the thin film transistors.

In one embodiment, the display device further includes a liquid crystal display device electrically connected with at least one of the thin film transistors.

BRIEF DESCRIPTION OF THE DRAWINGS

The accompanying drawings, together with the specification, illustrate exemplary embodiments of the present invention, and, together with the description, serve to explain the principles of the present invention.

DETAILED DESCRIPTION

Hereinafter, embodiments according to the present invention will be described with reference to the accompanying drawings.

Figure 2:
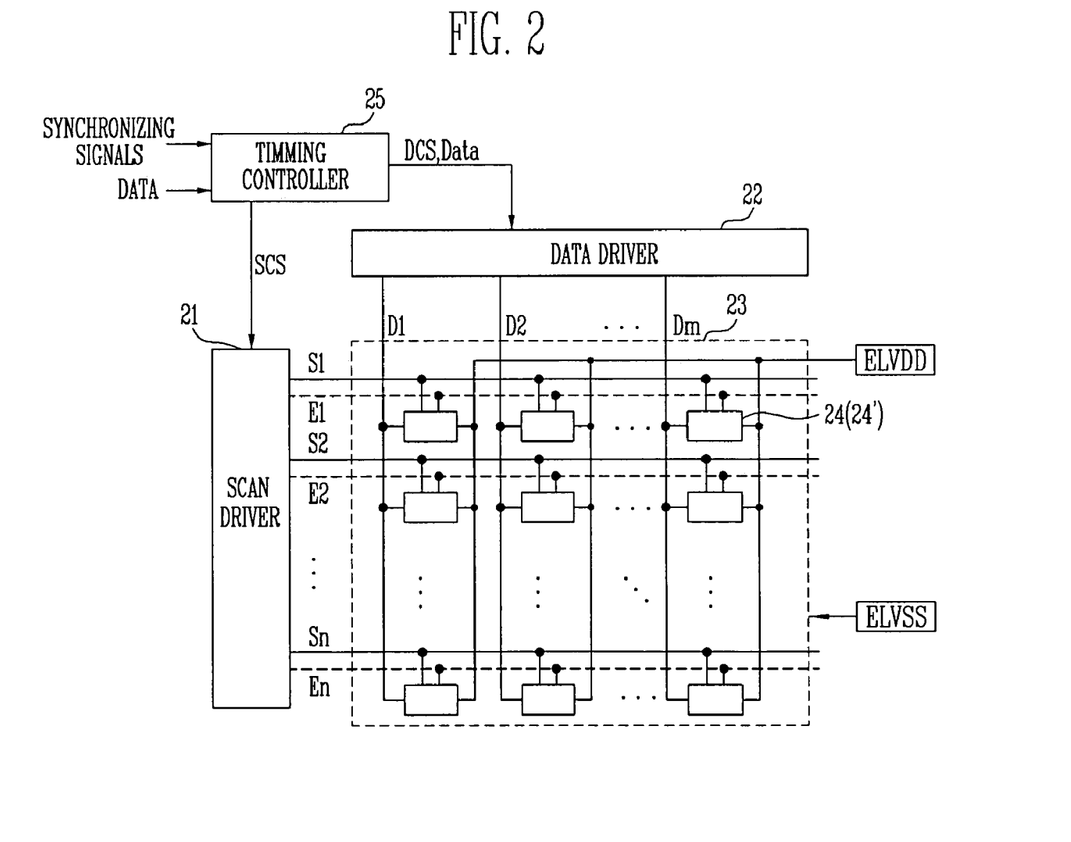
FIG. 2 is a circuit diagram illustrating an organic light emitting display device according to an embodiment of the present invention.

FIG. 2 is a circuit diagram illustrating an organic light emitting display device according to an embodiment of the present invention. Referring to FIG. 2, an organic light emitting display device according to the embodiment of the present invention includes an image display unit 23 including pixels 24 (24') formed at areas defined by crossings between scan lines S1 to Sn and data lines D1 to Dm, a scan driver 21 for driving the scan lines S1 to Sn, a data driver 22 for driving the data lines D1 to Dm, and a timing controller 25 for controlling the scan driver 21 and the data driver 22.

The timing controller 25 generates data driving control signals DCS and scan driving control signals SCS using synchronizing signals supplied from the outside. The data driving control signals DCS generated by the timing controller 25 are supplied to the data driver 22, and the scan driving control signals SCS generated by the timing controller 25 are supplied to the scan driver 21. The timing controller 25 supplies data Data supplied from the outside to the data driver 22.

The scan driver 21 receives the scan driving control signals SCS from the timing controller 25. The scan driver 21 supplies scan signals to the first to nth scan lines S1 to Sn. The scan driver 21 also supplies emission control signals to first to nth emission control lines E1 to En.

The data driver 22 receives the data driving control signals DCS from the timing controller 25. The data driver 22 supplies data signals to the data lines D1 to Dm whenever the scan signals are supplied. Thin film transistors (TFTs) (also referred to as driver circuit TFTs) for driving the drivers 21 and 22 are formed in the drivers 21 and 22.

The image display unit 23 receives a first power of a first power source ELVDD and a second power of a second power source ELVSS. The first and second powers of the first and second power sources ELVDD and ELVSS supplied to the image display unit 23 are supplied to the pixels 24 (24').

Figure 3:
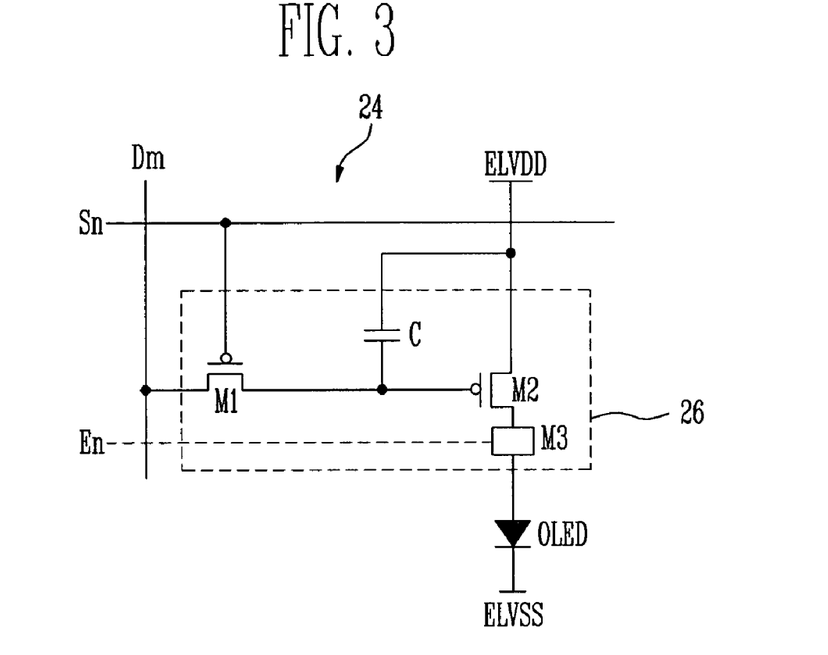
FIG. 3 is a circuit diagram illustrating a first embodiment of a pixel illustrated in FIG. 2.

FIG. 3 illustrates a first embodiment of a pixel 24 illustrated in FIG. 2. In FIG. 3, for convenience sake, the pixel 24 connected to the nth scan line Sn and the mth data line Dm is illustrated.

Referring to FIG. 3, the pixel 24 according to the first embodiment of the present invention includes an organic light emitting diode (OLED), and a pixel circuit 26 connected to the OLED, the data line Dm, the emission control line En, and the scan line Sn to emit light from the OLED. An anode electrode of the OLED is connected to the pixel circuit 26, and a cathode electrode of the OLED is connected to the second power source ELVSS. The OLED generates light corresponding to the current supplied from the pixel circuit 26.

The pixel circuit 26 includes a second pixel TFT M2 connected between the first power source ELVDD and the OLED; a first pixel TFT M1 connected with the second pixel TFT M2, the data line Dm, and the scan line Sn; and a storage capacitor C connected between a gate electrode of the second pixel TFT M2 and the first power source ELVDD. In addition, the pixel circuit 26 may include an emission control device (e.g., a switching transistor M3) connected with the emission control line.

A gate electrode of the first pixel TFT M1 is connected to the scan line Sn and a first electrode of the first pixel TFT M1 is connected to the data line Dm. A second electrode of the first pixel TFT M1 is connected to one side of the storage capacitor C and a gate electrode of the second pixel TFT M2. The first pixel TFT M1 is turned on when a scan signal is supplied from the scan line Sn to supply the data signal supplied from the data line Dm to the storage capacitor C. At this time, a voltage corresponding to the data signal is charged in the storage capacitor C. In addition, the first electrode of the first pixel TFT M1 or the second pixel TFT M2 is set as one of the source electrode or the drain electrode, and the second electrode of the first pixel TFT M1 or the second pixel TFT M2 is set as the electrode different from the first electrode. For example, when the first electrode is set as the source electrode, the second electrode is set as the drain electrode. The gate electrode of the second pixel TFT M2 is connected to one side of the storage capacitor C, and the first electrode of the second pixel TFT M2 is connected to the first power source ELVDD. The second electrode of the second pixel TFT M2 is connected to the OLED.

Figure 4:
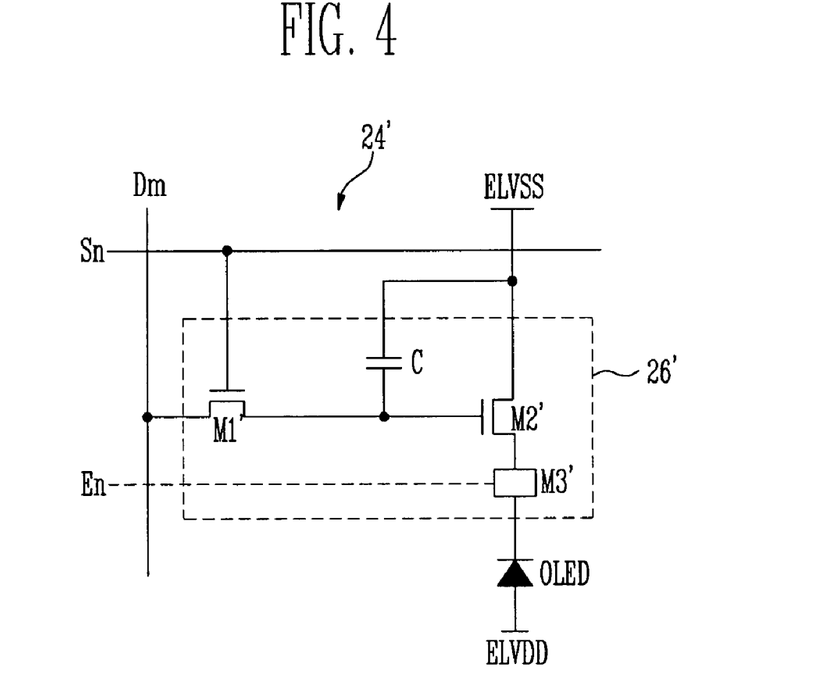
FIG. 4 is a circuit diagram illustrating a second embodiment of the pixel illustrated in FIG. 2.

FIG. 4 is a circuit diagram illustrating a second embodiment of a pixel 24' illustrated in FIG. 2. Referring to FIG. 4, the pixel 24' according to the second embodiment includes an OLED and a pixel circuit 26' connected to the OLED, the data line Dm, the emission control line En (connected with an emission control device M3'), and the scan line Sn to emit light from the OLED in a manner that is substantially the same as the pixel 24 and the pixel circuit 26 according to the first embodiment. Therefore, a detailed description of the components that constitute the pixel circuit 26' will be omitted.

Figure 5:
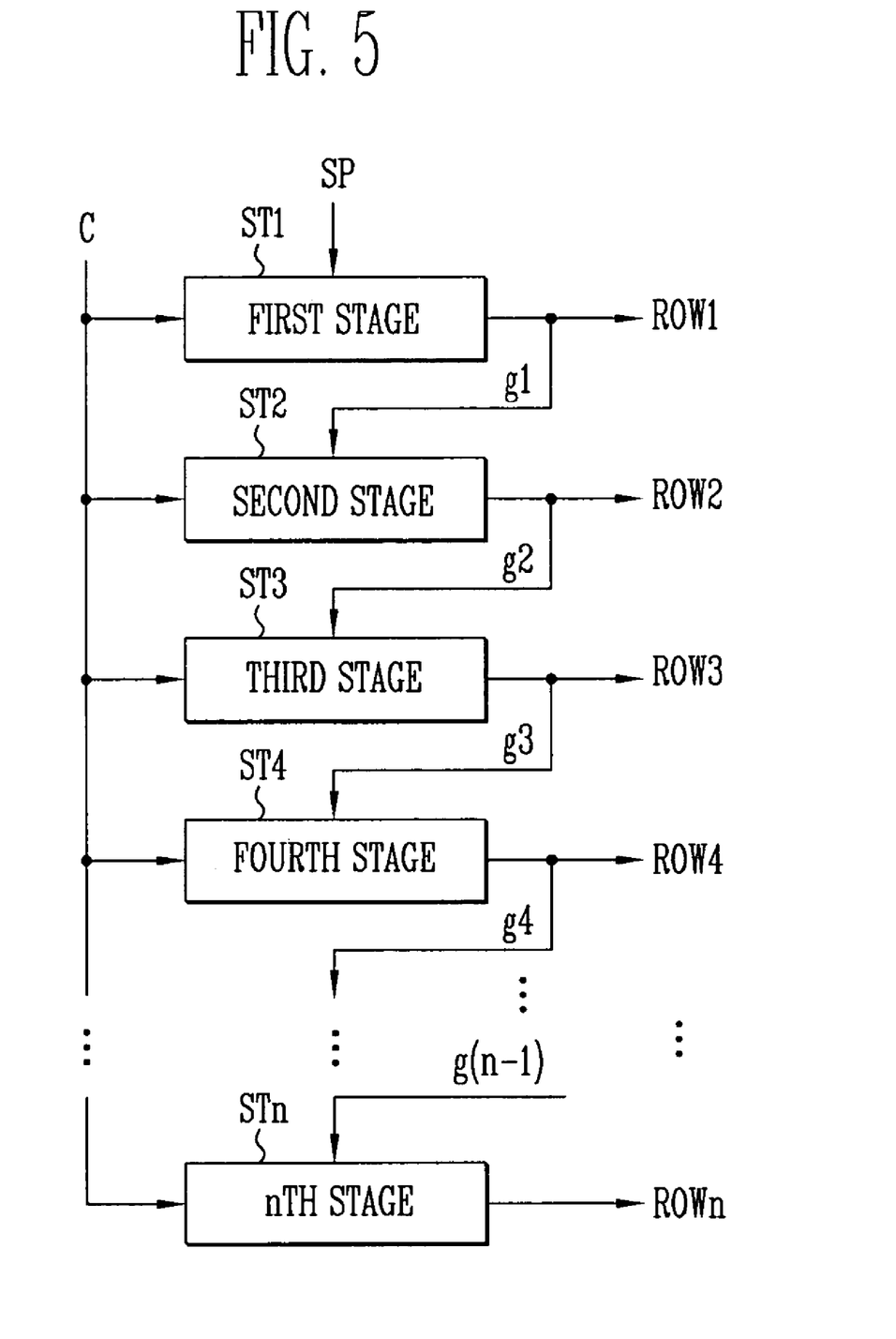
FIG. 5 is a block diagram illustrating a structure of a shift register of FIG. 2.

However, in the pixel 24' according to the second embodiment, NMOS pixel TFTs M1' and M2' are used. FIG. 5 is a block diagram illustrating the structure of a shift register.

As illustrated in FIG. 5, the shift register according to an embodiment of the present invention includes n stages ST1 to STn connected to a start pulse SP input line. Also, each of the n stages ST1 to STn is connected to three clock signal supply lines C selected from among four clock signal supply lines for supplying clock signals CLK1 to CLK4.

In the shift register illustrated in FIG. 5, the output lines of the n stages are connected to n row lines ROW1 to ROWn (e.g., scan lines S1, S2, S3, S4, . . . . Sn) included in a pixel array, respectively. Each of the stages inputs only three clock signals selected from among the four clock signals CLK1 to CLK4 whose phases are sequentially delayed. For example, when the first, third, and fourth clock signals CLK1, CLK3, and CLK4 are input to the first stage ST1, three clock signals CLK2, CLK4, and CLK1 whose phases are sequentially delayed by one clock signal are input to the second stage ST2 and three clock signals whose phases are sequentially delayed by one clock signal are input to each of the third to nth stages in substantially the same manner.

When the start pulse SP is supplied to the first stage ST1, each of the stages shifts the start pulse SP by one clock signal to supply the shifted start pulse SP to the output line thereof and the output signals g1 to g(n−1) of the first to (n−1)th stages ST1 to ST(n−1) are supplied to the next stages as start pulses so that the n row lines ROW1 to ROWn (e.g., scan lines S1 to Sn) are sequentially driven.

Hereinafter, the present invention will be described in more detail with reference to figures illustrating TFTs formed on flexible substrates.

Figure 6A:
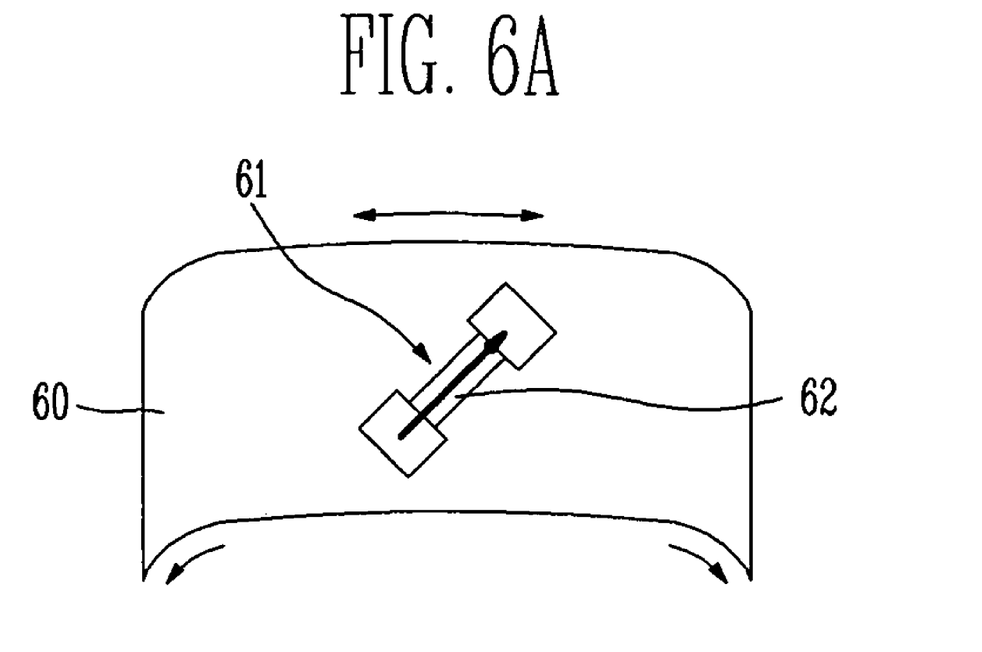
FIGS. 6A and 6B schematically illustrate a TFT formed on a flexible substrate according to an embodiment of the present invention.
Figure 6B:
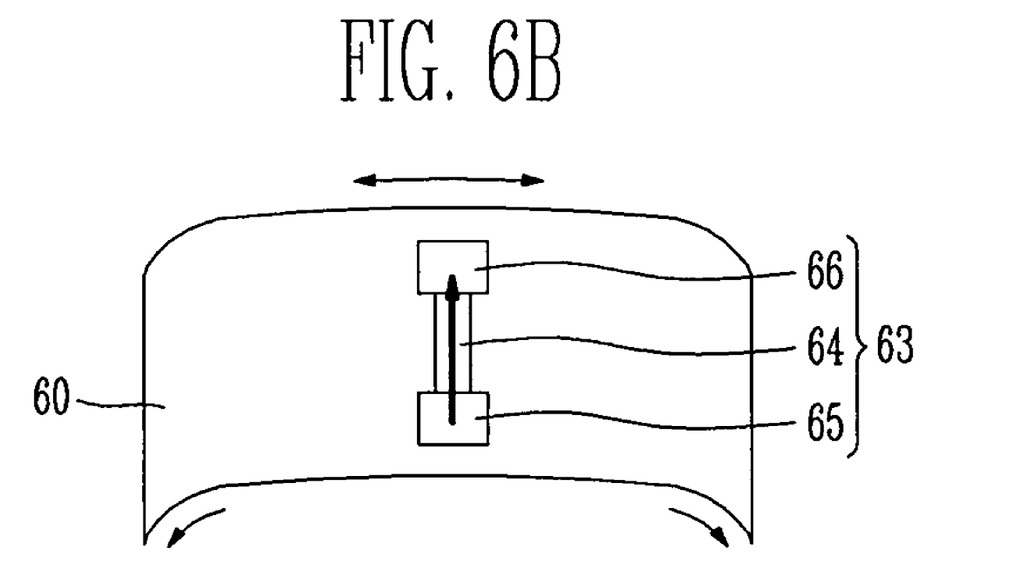

FIGS. 6A and 6B schematically illustrate a TFT 61 (63) formed on a flexible substrate 60. Referring to FIG. 6A, the TFT 61 is formed on the flexible substrate 60 so that a channel region 62 that forms the TFT 61 makes a predetermined angle (about 45°) with the direction in which the substrate 60 is bent.

In FIG. 6B, the TFT 63 including a semiconductor layer having a channel region 64, a source electrode 65, and a drain electrode 66 is formed on the flexible substrate 60. The channel region 64 of the TFT 63 is formed to be perpendicular to the direction in which the substrate 60 is bent. To be specific, the direction of the current through the channel region 64 is perpendicular to the direction in which the substrate 60 is bent.

Figure 7:
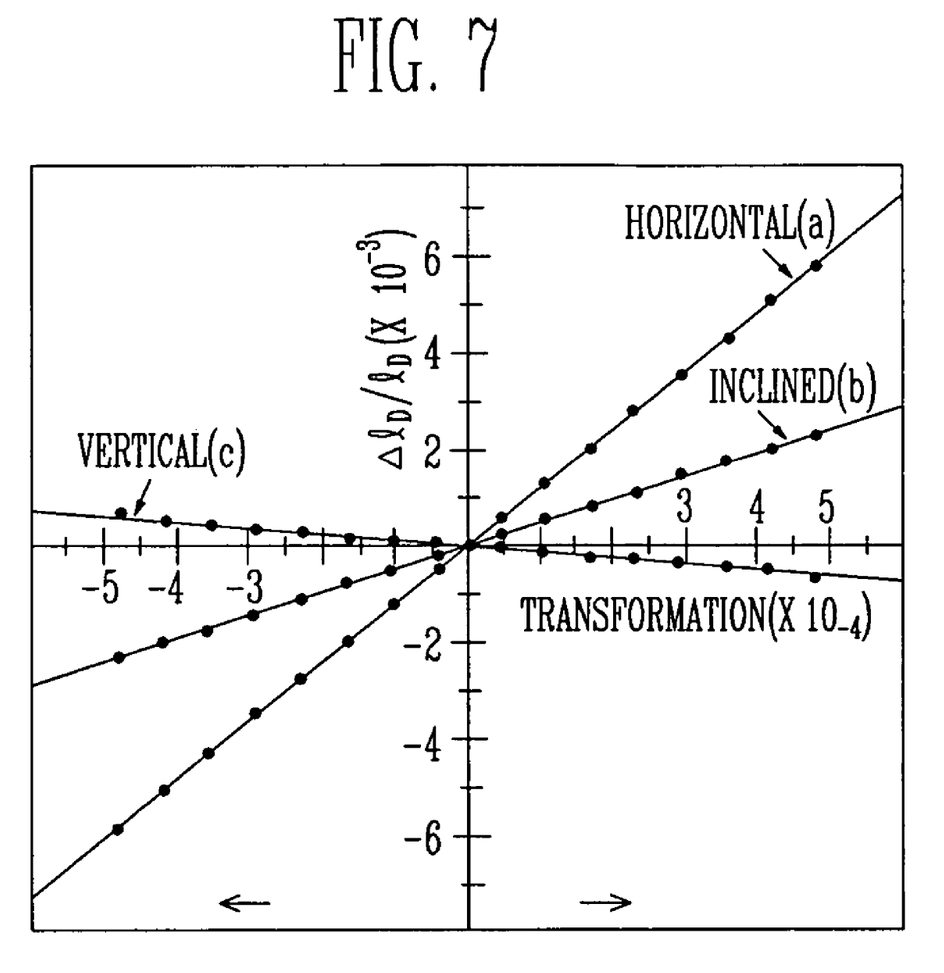
FIG. 7 are graphs illustrating the flow of currents of the TFTs illustrated in FIGS. 1 and 6A and 6B.

FIG. 7 shows graphs illustrating the flow of the currents of the TFTs illustrated in FIGS. 1 and 6A and 6B. Referring to FIG. 7, the horizontal axis denotes the strain of the substrate and the vertical axis denotes the amount of change in current.

The graph (a) describes the case in which the direction in which the substrate 1 is bent is parallel to the channel region 11. In more detail, the graph (a) describes the case in which the direction in which the substrate 1 is bent is parallel to the direction in which a channel is formed, that is, the longitudinal direction of the channel region 11. In this case, the amount of change of current increases in proportion to the force applied to the substrate 1.

The graph (b) describes the case in which the direction in which the substrate 60 is bent to make the predetermined angle (about 45°) with the longitudinal direction of the channel region 62. In this case, the amount of current increases in proportion to the force applied to the substrate 60. However, the amount of change is smaller than in the case where the direction in which the substrate 1 is bent is parallel to the longitudinal direction of the channel region 11.

Finally, the graph (c) describes the case in which the direction in which the substrate 60 is bent is perpendicular to the direction in which the channel region 64 is formed. In this case, the force applied to the substrate 60 and the amount of change in the current that flows through the channel region 64 hardly change and substantially the same amount of the current flows.

As a result in certain embodiments of the present invention, referring to FIGS. 6A and 6B, a direction in which a substrate (e.g., 60) is bent makes a predetermined angle other than 0 with a channel direction (e.g., 62 or 64) of a TFT (e.g., 61 or 63). In one embodiment, the direction in which the substrate is bent is perpendicular to the longitudinal direction of the channel region (e.g., 64), thereby resulting in almost no change in current.

Figure 8:
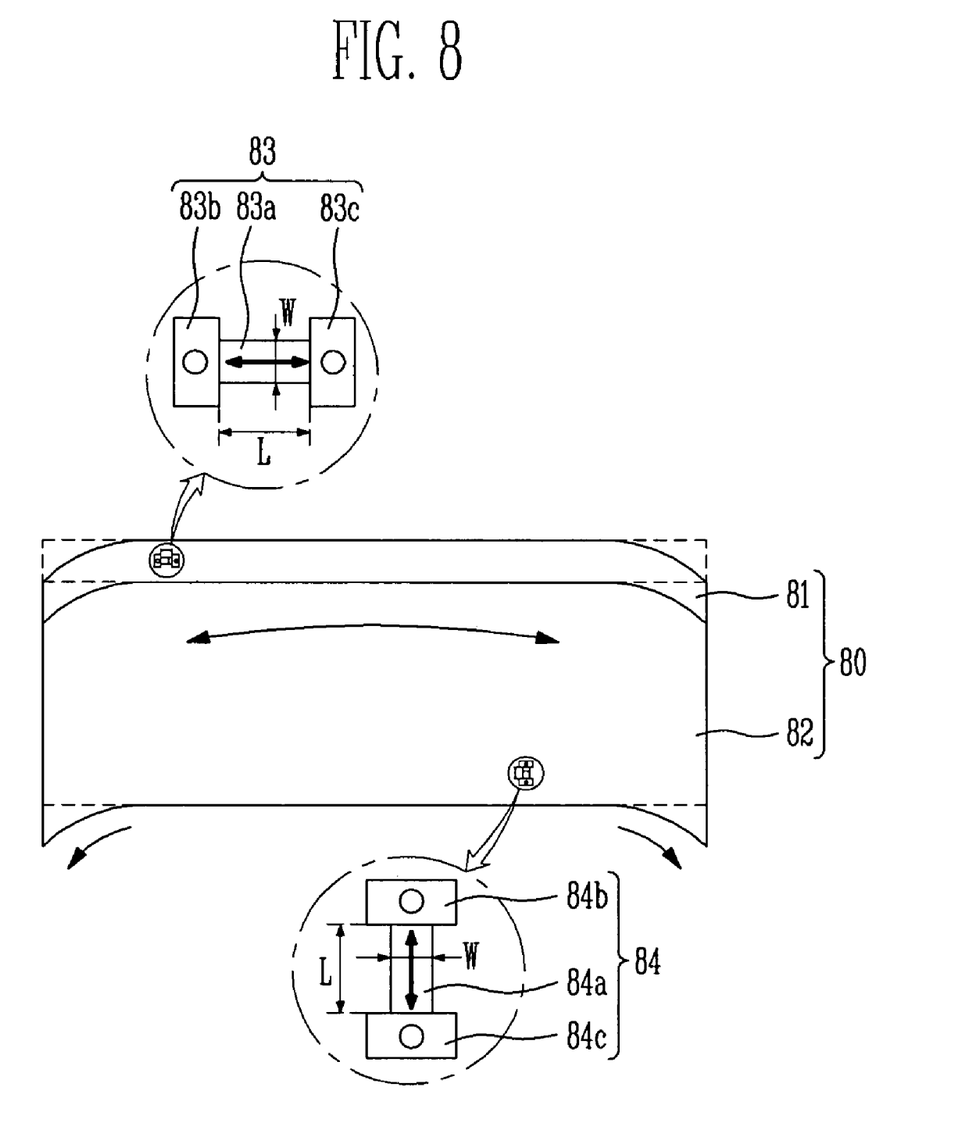
FIGS. 8 to 10 are plan views schematically illustrating flat panel display devices (FPDs) according to embodiments of the present invention.
Figure 9:
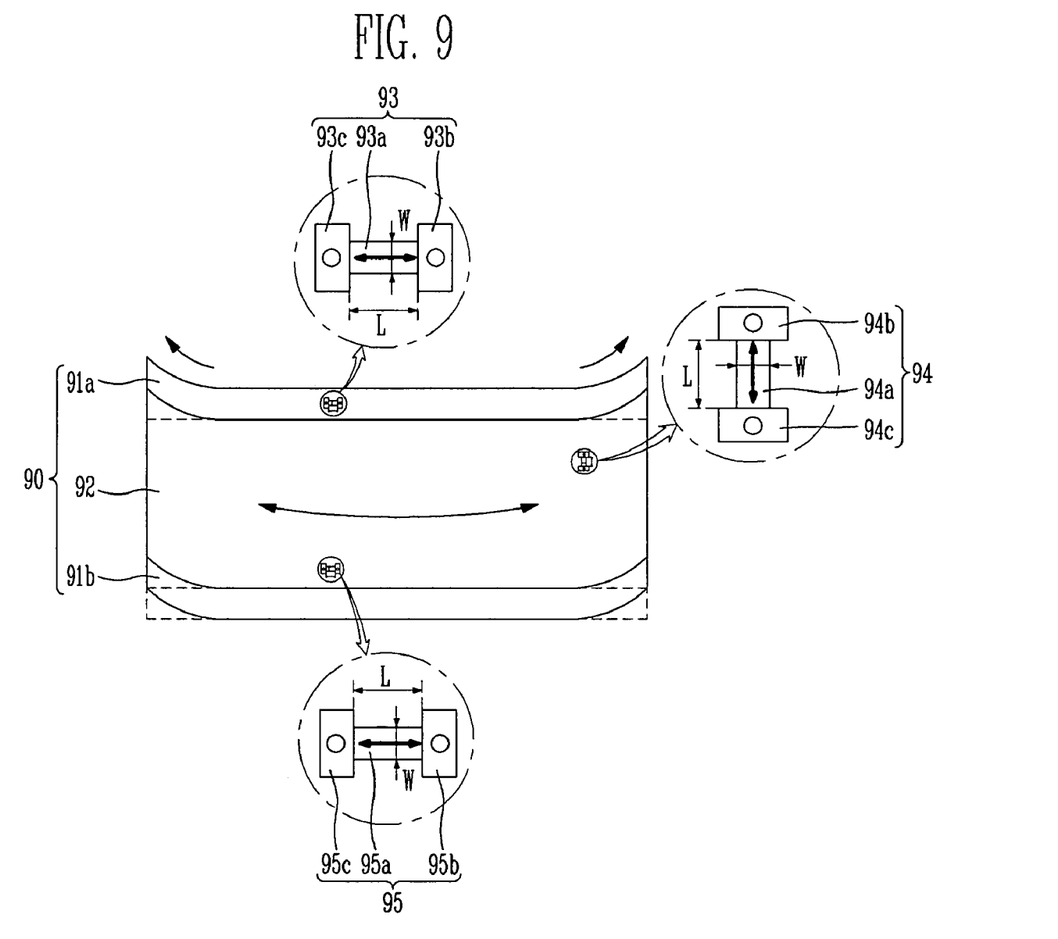
Figure 10:
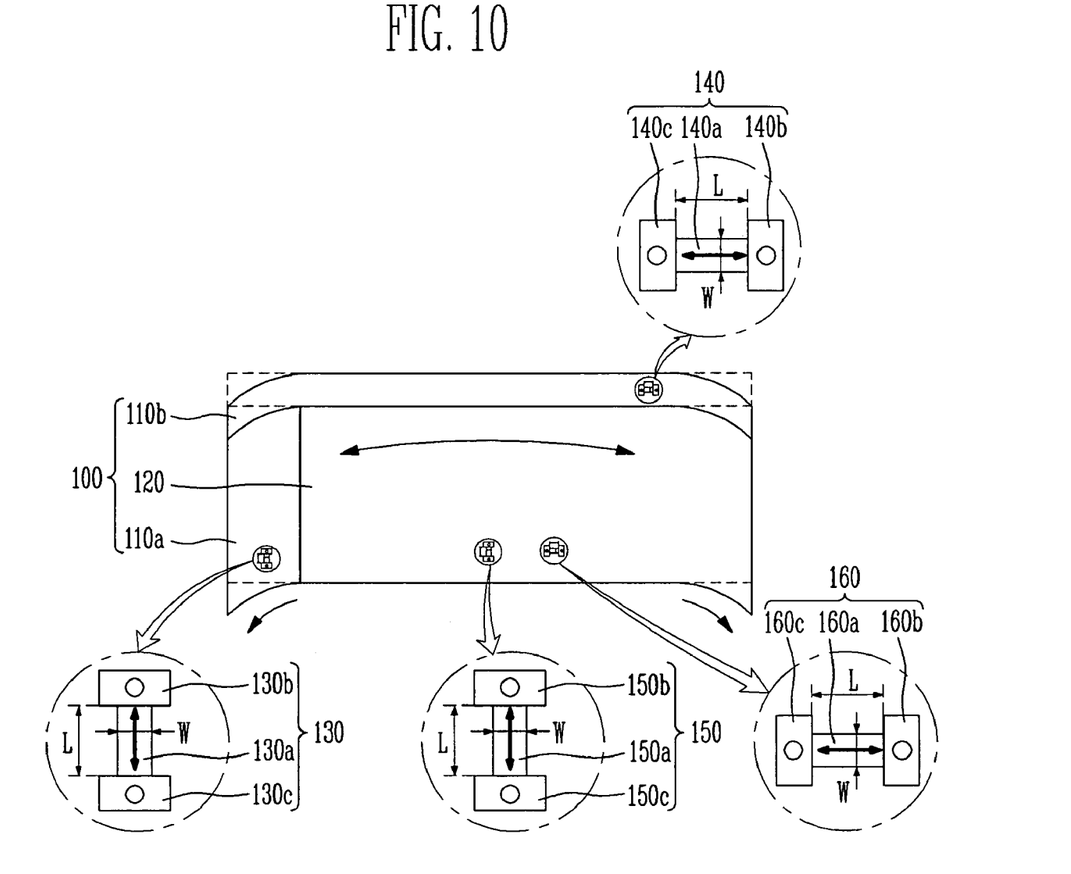

FIGS. 8 to 10 are plan views schematically illustrating flat panel display devices (e.g., organic light emitting display devices) according to the embodiments of the present invention.

First, referring to FIG. 8, the display device includes a flexible substrate 80 on which a driving circuit region 81 and an image region 82 are formed. A TFT 83 is formed on the driving circuit region 81, and a TFT 84 is formed on the image region 82. In addition, one or more OLEDs (not shown) electrically connected to the TFT 84 is formed on the image region 82. In another embodiment, a liquid crystal display device (LCD) (not shown) electrically connected to the TFT 84 may be formed on the image region 82 instead of the OLEDs. The driving circuit region 81 may be formed on (or with) the image region 82.

In particular, the substrate 80 is a flexible metal thin film formed of stainless steel (sus) and/or titanium (Ti). The TFT 83 is formed on the image region 82, and the TFT 84 is formed on the driving circuit region 81 formed on the substrate 80. Each of the TFTs 83 and 84 includes a semiconductor layer (not shown) formed on the substrate 80, a gate electrode (not shown) formed on the semiconductor layer, and source electrodes and drain electrodes 83b and 84b and 83c and 84c. The semiconductor layer is formed of a low temperature polysilicon layer, in particular, germanium (Ge) and/or a Ge compound. Source and drain regions (not shown) electrically connected to the source and drain electrodes 83b and 84b and 83c and 84c and channel regions 83a and 84a formed under gate electrodes are formed in the semiconductor layer. The channel regions 83a and 84a of the TFTs 83 and 84 have length L and width W.

According to the present embodiment, the TFT 83 is a driver circuit TFT that drives the driver circuit of the driving region. The longitudinal direction L of the channel region 83a is parallel to the direction in which the substrate 80 is bent. On the other hand, the TFT 84 is a pixel TFT that drives the pixel of the image region. The longitudinal direction L of the channel region 84a makes a predetermined angle with, that is, is almost perpendicular to, the direction in which the substrate 80 is bent. The angle that the longitudinal direction of the channel region of the pixel TFT makes with the direction in which the substrate is bent can be in the range from 45° to 90°. The pixel TFT included in a pixel can be formed by two or more TFTs. In one embodiment, the pixel TFT includes a switching TFT and a driving TFT. For sake of convenience, according to the present embodiment, one pixel TFT is formed on the driving region 81 and the image region 82. However, a plurality of TFTs (e.g., pixel TFTs) may be formed on the regions 81 and 82.

Hereinafter, in order to avoid redundancy, detailed description of some of the components that are substantially the same as the components illustrated in FIG. 8 will be omitted.

Referring to FIG. 9, driving circuit regions 91a and 91b and an image region 92 are formed on a flexible substrate 90, the driving circuit regions 91a and 91b are formed above and below the image region 92. A TFT 93 is formed on the driving circuit region 91a, and TFTs 94 and 95 are formed on the image region 92. The TFTs 93, 94 and 95 formed on the driving circuit region 91a and the image region 92 include semiconductor layers (not shown), gate electrodes (not shown), source electrodes 93b, 94b and 95b, and drain electrodes 93c, 94c, and 95c. The channel regions 93a, 94a and 95a included in the TFTs 93, 94 and 95 are formed to make a predetermined angle with the direction in which the substrate 90 is bent. Here, change in current is reduced as the direction in which the substrate 90 is bent moves closer to be perpendicular with the longitudinal direction of the channel regions 93a, 94a, and 95a.

According to the present embodiment, the two TFTs 94 and 95 are formed on the image region 92. One of the two TFTs 94 and 95 may be a switching TFT 94 and the other may be a driving TFT 95. The longitudinal direction of the channel region 94*a* of the switching TFT 94 is perpendicular to the direction in which the substrate 90 is bent. The channel region 95*a* of the driving TFT 95 is parallel to the direction in which the substrate 90 is bent. That is, the longitudinal direction of the channel region 94*a* of the switching TFT 94 is different from the longitudinal direction of the channel region 95*a* of the driving TFT 95.

Driving circuit regions 110*a* and 110*b* and an image region 120 are formed on a flexible substrate 100 illustrated in the embodiment of FIG. 10. According to the present embodiment, the driving circuit region 110*a* is formed on the left (or a side) of the image region 120 and the driving circuit region 110*b* is formed above the image region 120. TFTs 130, 140, 150, and 160 are formed on the driving circuit regions 110*a* and 110*b* and the image region 120 so that the channel regions 130*a*, 140*a*, 150*a*, and 160*a* of the TFTs 130, 140, 150, and 160 make a respective predetermined angle with the direction in which the substrate 100 is bent. According to the present embodiment, the longitudinal direction of the channel region 140*a* of the TFT 140 formed on the driving circuit region 110*b* is parallel to the direction in which the substrate 100 is bent. The channel region 130*a* of the TFT 130 formed on the driving circuit region 110*a* is formed to be perpendicular to the direction in which the substrate 100 is bent. The TFTs 130, 140, 150, and 160 include semiconductor layers (not shown), gate electrodes (not shown), source electrodes 130*b*, 140*b*, 150*b*, and 160*b*, and drain electrodes 130*c*, 140*c*, 150*c*, and 160*c*. According to the present embodiment, the channel region 150*a* of the TFT 150 formed on the image (or pixel circuit) region 120 is formed to be perpendicular to the direction in which the substrate 100 is bent. The channel region 160*a* of the TFT 160 is formed to be parallel to the direction in which the substrate 100 is bent. To be specific, the driving TFT 160 is formed to be parallel to the direction in which the substrate 100 is bent and the switching TFT 150 is formed to be perpendicular to the direction in which the substrate 100 is bent.

As a result, according to the above-described embodiments, the longitudinal direction (L) of the channel regions of certain TFTs is perpendicular to the direction in which a substrate is bent so that stress can be applied to the flexible substrate without significantly changing an amount of current flow. Therefore, although the substrate is bent, the flow of current is not significantly affected. When stress is applied to the substrate, since the width (W) of the channel regions of certain other TFTs increases, it is also possible to improve current mobility in these certain other TFTs.

According to the above-described embodiments, a driving circuit region is formed at one region along the circumference of an image region. However, a driving circuit region may be formed at various other suitable regions along the circumference of the image region. Also, according to the above-described embodiments, the image region and the driving circuit region are formed on a single substrate. However, the driving circuit region may be separately formed and electrically connected to the image region.

According to the above-described embodiments, an OLED or a LCD that constitutes a display device was described. However, the OLED or the LCD may be separately formed to be electrically connected to the TFT formed in the display device.

As described above, according to the present invention, when a TFT is formed on a flexible substrate, the direction in which the substrate is bent makes a predetermined angle with the channel region of the TFT so that it is possible to significantly reduce a change in the amount of current that flows through the channel region. Therefore, it is possible to minimize deterioration or change in the electrical property of the TFT and to thus improve the performance and the resolution of a display device.

While the invention has been described in connection with certain exemplary embodiments, it is to be understood by those skilled in the art that the invention is not limited to the disclosed embodiments, but, on the contrary, is intended to cover various modifications included within the spirit and scope of the appended claims and equivalents thereof.

What is claimed is:

1. A display device comprising:
   a flexible substrate; and
   a plurality of thin film transistors on the substrate,
   wherein the plurality of thin film transistors on the substrate comprise a pixel transistor for driving a pixel and a driver circuit transistor for driving a driver circuit,
   wherein a longitudinal direction of a channel region of the pixel transistor makes a first angle other than 0° with a direction in which the substrate is bent, and
   wherein a longitudinal direction of a channel region of the driver circuit transistor is different from the longitudinal direction of the channel region of the pixel transistor.

2. The display device as claimed in claim 1, wherein the longitudinal direction of the channel region of the driver circuit transistor makes a second angle other than 0° with the longitudinal direction of the channel region of the pixel transistor.

3. The display device as claimed in claim 1, wherein the pixel transistor comprises a switching transistor and a driving transistor.

4. The display device as claimed in claim 3, wherein a longitudinal direction of a channel region of the switching transistor is different from a longitudinal direction of a channel region of the driving transistor.

5. The display device as claimed in claim 3, wherein a longitudinal direction of a channel region of the driving transistor is in substantially the same direction as the direction in which the substrate is bent.

6. The display device as claimed in claim 1, wherein the first angle the longitudinal direction of the channel region of the pixel transistor makes with the direction in which the substrate is bent is between about 45° and about 90°.

7. The display device as claimed in claim 1, wherein the substrate comprises at least one of a metal material or a plastic material, and wherein a characteristic of the substrate is to be transformed by an application of an external force on the substrate.

8. The display device as claimed in claim 7, wherein the metal material comprises at least one of a stainless steel (sus) material or a titanium (Ti) material.

9. The display device as claimed in claim 1, wherein at least one of the thin film transistors on the substrate comprises a semiconductor layer formed with low temperature polysilicon.

10. The display device as claimed in claim 1, wherein the semiconductor layer comprises germanium (Ge) and/or a Ge compound.

11. The display device as claimed in claim 1, further comprising an organic light emitting diode electrically connected with at least one of the thin film transistors.

12. The display device as claimed in claim 1, further comprising a liquid crystal display device electrically connected with at least one of the thin film transistors.

13. The display device as claimed in claim 1, wherein the display device is an organic light emitting display device.

14. The display device as claimed in claim 1, further comprising at least one of an organic light emitting diode or a liquid crystal display device electrically connected with the pixel thin film transistor.

15. A display device comprising:
a flexible substrate;
a pixel thin film transistor for driving a pixel and formed on the substrate; and
a driver circuit thin film transistor for driving a driver circuit and formed on the substrate,
wherein a longitudinal direction of a channel region of the pixel thin film transistor makes an angle other than 0° with a direction in which the substrate is bent, and
wherein a longitudinal direction of a channel region of the driver circuit thin film transistor is different from the longitudinal direction of the channel region of the pixel thin film transistor.

16. The display device as claimed in claim 15, wherein the angle is in the range from about 45° to about 90°.

17. A display device comprising:
a flexible substrate; and
a plurality of thin film transistors on the substrate,
wherein a first thin film transistor and a second thin film transistor of the plurality of thin film transistors on the substrate comprise a first channel region and a second channel region, respectively, having a first longitudinal direction and a second longitudinal direction, respectively, and
wherein the first longitudinal direction of the first channel region makes a first angle in the range from about 45° to about 90° with a direction in which the substrate is bent, and
wherein the second longitudinal direction of the second channel region makes a second angle with the direction in which the substrate is bent, the second angle being different from the first angle.

18. The display device as claimed in claim 17, further comprising at least one of an organic light emitting diode or a liquid crystal display device electrically connected with at least one of the thin film transistors.

* * * * *